United States Patent [19]

Bailey et al.

[11] Patent Number: 5,023,032

[45] Date of Patent: Jun. 11, 1991

[54] ELECTROSTRICTIVE CERAMIC MATERIAL INCLUDING A PROCESS FOR THE PREPARATION THEREOF AND APPLICATIONS THEREFOR

[75] Inventors: Alex E. Bailey, Cockeysville; Stephen R. Winzer, Ellicott City; Audrey E. Sutherland, Eldersburg; Andrew P. Ritter, Baltimore, all of Md.

[73] Assignee: Martin Marietta Corporation, Bethesda, Md.

[21] Appl. No.: 579,205

[22] Filed: Aug. 31, 1990

Related U.S. Application Data

[63] Continuation of Ser. No. 256,030, Oct. 7, 1988, abandoned, which is a continuation-in-part of Ser. No. 106,468, Oct. 9, 1987, abandoned.

[51] Int. Cl.$^5$ ............................................. C04B 35/64
[52] U.S. Cl. ........................................ 264/63; 264/65; 501/136; 501/137; 501/138
[58] Field of Search ............... 501/134, 135, 136, 137, 501/138, 139; 265/65, 63

[56] References Cited

U.S. PATENT DOCUMENTS

| | | | |
|---|---|---|---|
| 4,287,075 | 9/1981 | Fujiwara et al. | 106/39.5 |
| 4,383,196 | 5/1983 | Perduijn et al. | 310/358 |
| 4,482,935 | 11/1984 | Wheeler | 361/321 |
| 4,524,294 | 6/1985 | Brody | 310/311 |
| 4,536,821 | 8/1985 | Wheeler et al. | 361/321 |
| 4,555,494 | 11/1985 | Nishida et al. | 501/134 |
| 4,568,848 | 2/1986 | Ogawa | 310/313 |
| 4,626,369 | 12/1986 | Walker, Jr. | 252/62.9 |
| 4,712,156 | 12/1987 | Bardhan | 501/135 |
| 4,767,732 | 8/1988 | Furukawa | 501/136 |

OTHER PUBLICATIONS

Kenji Uchino, Yuzuru Tsuchiya, Shoichiro Nomura, Takuso Sato, Hiromi Ishikawa, and Osamu Ikeda, "Deformable Mirror Using the PMN Electrostrictor", *Applied Optics*, vol. 20, No. 17, Sep. 1, 1981.

V. A. Bokov and I. E. Myl'nikova, "Electrical & Optical Properties of Single Crystals of Ferroelectrics with a Diffused Phase Transition", *Soviet Physics—Solid State*, vol. 3, No. 3, Sep. 1961.

G. A. Smolensky, "Physical Phenomena in Ferroelectrics with Diffused Phase Transition", *Journal of the Physical Society of Japan*, vol. 28, Supplement, 1970.

K. Uchino and S. Norma and L. E. Cross, S. J. Jang, and R. E. Newnham, "Electrostrictive Effect in Lead Magnesium Niobate Single Crystals", *J. Applied Physics*, Section 1(12), Feb. 1980.

*Primary Examiner*—James Derrington
*Attorney, Agent, or Firm*—Herbert W. Mylius; Alan G. Towner; Gay Chin

[57] ABSTRACT

This invention relates to new ceramic electrostrictive compositions having superior electrical properties, a process for the preparation of the new electrostrictive compositions and applications for the new compositions. Specifically, a solid solution composition of lead magnesium niobate-lead titanate—(barium titanate or strontium titanate) has exhibited desirable electrostrictive properties. This composition shows a diminished dependence of dielectric constant on temperature.

14 Claims, 16 Drawing Sheets

A — 2% BT — 1kHz

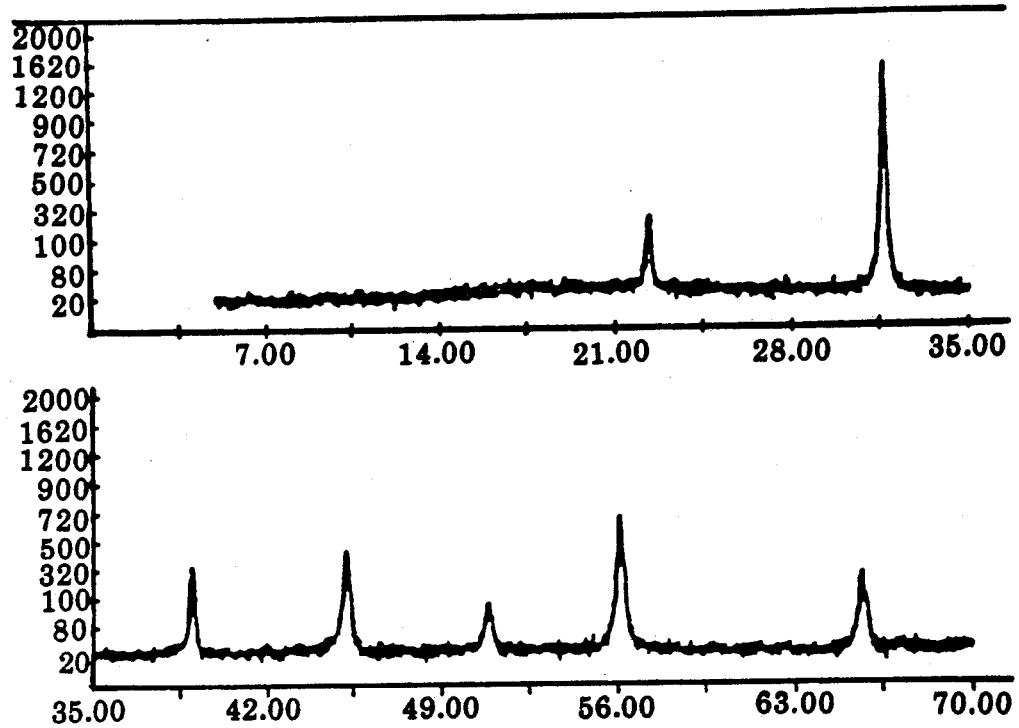
FIG. 13a-1
FIG. 13a-2
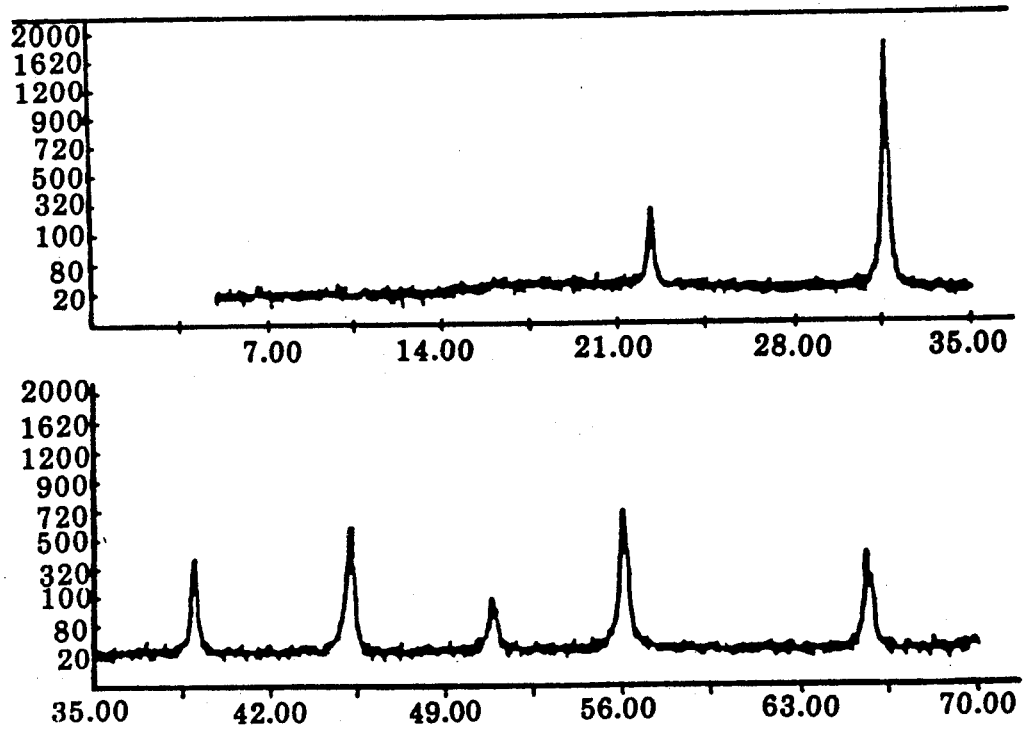
FIG. 13b-1
FIG. 13b-2

FIG. 14a-1
FIG. 14a-2
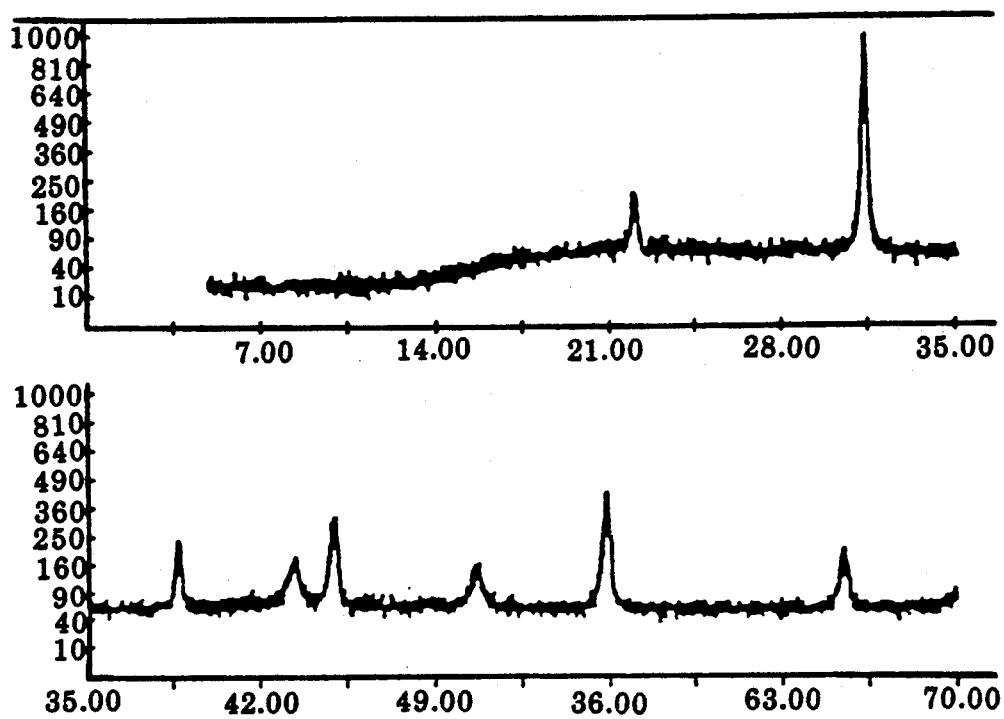
FIG. 14b-1
FIG. 14b-2
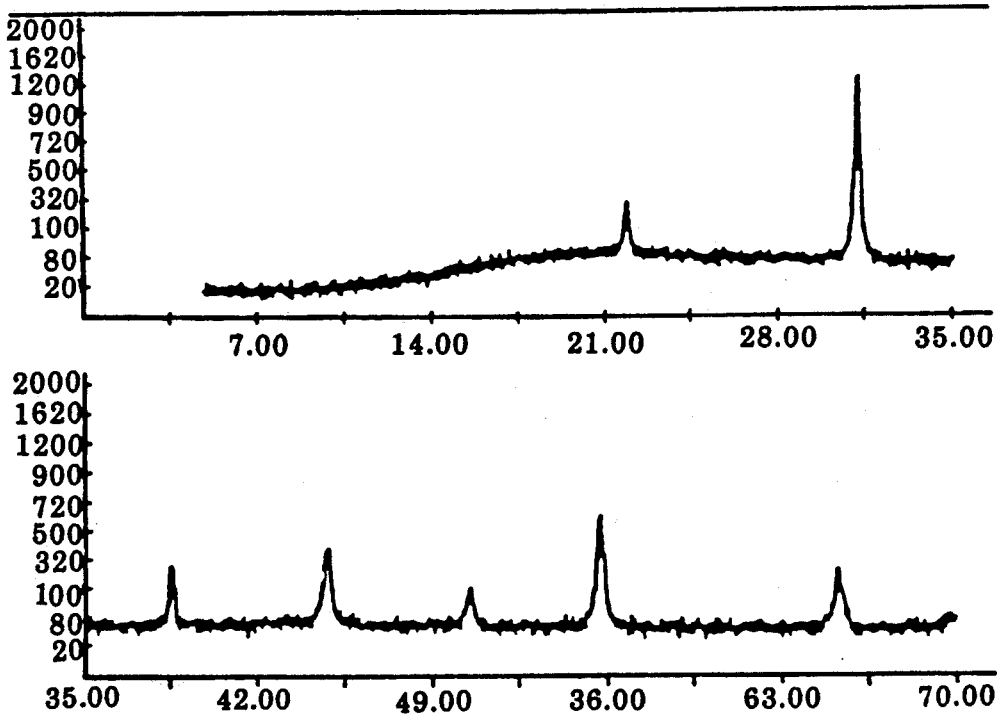

ELECTROSTRICTIVE CERAMIC MATERIAL INCLUDING A PROCESS FOR THE PREPARATION THEREOF AND APPLICATIONS THEREFOR

The United States Government has rights in this invention pursuant to contract number F29601-84-C-0017, awarded by the United States Air Force.

This application is a continuation of application Ser. No. 256,030, filed Oct. 7, 1988, now abandoned which is a continuation-in-part of application Ser. No. 106,468, filed Oct. 9, 1987. Now abandoned.

BACKGROUND OF THE INVENTION

1. Field Of The Invention

This invention relates to new ceramic electrostrictive compositions, a process for the preparation of the compositions into an electrostrictvie material and specific applications for the electrostrictive material.

2. Description Of The Prior Art

The electrostrictive effect relates to a lattice phenomenon in the crystal lattice of materials. Particularly, the electrostrictive effect comes from the direct attraction and repulsion of anions and cations in a crystal lattice, said attraction and repulsion resulting from the application of an external electric field. The attraction and/or repulsion in the crystal lattice results in a physical distortion of the lattice. This lattice distortion causes a displacement or strain in the material. Stated quantitatively, the strain in an electrictive material is proportional to the electrostrictive coefficient multiplied by the square of the electric field. The relationship between strain and polarization and the relationship between strain and dielectric constant are shown below in Equations 1a and 1b, wherein S=strain, Q=electrostrictive coefficient, K=dielectric constant (relative permittivity at the applied field), $\Sigma o$=permittivity of free space, P=polarization and E=applied electric field:

$$S = QP^2 \qquad \text{[Equation 1a]}$$

$$S = Q(K\Sigma o)^2 E^2 \qquad \text{[Equation 1b]}$$

The electrostrictive effect should not be confused with the piezoelectric effect, or more particularly, the converse piezoelectric effect. In the converse piezoelectric effect the amount of strain which occurs in a piezoelectric material is equal to the piezoelectric strain coefficient multiplied by the electric field. The relationship between strain and applied electric field is shown below in Equation 2, wherein S=strain, d=piezoelectric strain coefficient and E=applied electric field.

$$S = dE \qquad \text{[Equation 2]}$$

Moreover, a single material can exhibit both the piezoelectric effect and the electrostrictive effect. To exemplify how a material can show both the piezoelectric and the electrostrictive effect, reference is made to FIG. 1.

FIG. 1 shows a simplified curve for a material which exhibits both a piezoelectric effect and an electrostrictive effect. Particularly, FIG. 1 shows the relationship between dielectric constant and temperature for such a material. The temperature at which the dielectric constant is the highest, at a specific frequency, is known as the Curie Point Temperature (hereinafter referred to as $T_C$). On the low temperature side of $T_C$ (i.e., the "A" portion of FIG. 1) the material is ferroelectric (i.e., the material is non-isotropic). When the material is ferroelectric, it typically has a tetragonal or rhombohedral crystal structure and is capable of being poled. Thus, individual domains within the material will attempt to align themselves with an externally applied electric field causing the otherwise randomly oriented dipoles of the polycrystalline material to be oriented. Such orientation results in a net distribution of positive and negative charges in the polycrystalline material (i.e., a dipole). Piezoelectric materials can then be utilized for such applications as transducers for sound (e.g., microphones, alarm systems), high power ultrasonic generators (e.g., sonar, ultrasonic cleaning), pick-ups and sensors (e.g., record players), resonators and filters (e.g., radio, television), and the like.

However, on the high temperature side of $T_C$ (i.e., the "B" portion of FIG. 1), the material is paraelectric (i.e., the material is isotropic). When the material is paraelectric, it typically has a cubic crystal structure. It is the paraelectric phase of particular ceramic compositions which is the focus of this application.

Lead magnesium niobate (hereinafter referred to as PMN) was discovered to be ferroelectric as early as 1961. In approximately 1980, the electrostriction phenomenon was discovered to exist in PMN. However, pure PMN has a $T_C$ which occurs at approximately $-20°$ C. Moreover, the dielectric constant for PMN is very temperature dependent which means that a slight deviation from the temperature at which $T_C$ occurs leads to a large change in the dielectric constant. Thus, attempts have been made to modify the pure PMN system with dopants. For example, PMN has been doped with between 8-10 mole percent lead titanate (hereinafter referred to as PT). By doping PMN with PT, thereby resulting in a PMN-PT solid solution, the $T_C$ was raised to a higher temperature and the resulting dielectric constant for the PMN-PT solid solution was higher than the dielectric constant of pure PMN. Thus, the strain which can be developed in the PMN-PT system is higher than the strain which can result in the pure PMN system because the dielectric constant for the PMN-PT system is higher at $T_C$. Accordingly, because strain is proportional to the square of the dielectric constant in an electrostrictive composition, a small change in dielectric constant can have a dramatic impact on the resultant strain in the material. Thus, PMN doped with 8-10 mole percent of PT results in a material which has a $T_C$ closer to room temperature. This shifting of $T_C$ is very important for the following reasons.

If an electrostrictive material is to be used at room temperature, it is desirable for that material to exhibit a $T_C$ at or near room temperature. This permits maximization of the dielectric constant and thus maximization of strain. However, for many applications a constant environmental temperature, such as room temperature, cannot be assured. Thus, in reference to FIG. 1, it is clear that for known electrostrictive materials the dielectric constant is largely dependent upon temperature. Accordingly, all previously known applications for electrostrictive materials have been restricted to environments which have a substantially constant temperature. However, if it is desired to use electrostrictive materials for applications in which constant environmental temperatures cannot be assured, then the known prior art compositions are inadequate.

For example, in reference to FIG. 1, if the environmental temperature to which the electrostrictive material is exposed changes as little as 20° C., the dielectric constant could be reduced in value by ⅓-½. This would be undesirable from an application perspective because such changes in dielectric constant would result in fluctuating measurements. Alternatively, the calibration or control devices connected to the electrostrictive material would have to be very complex to compensate for such fluctuations in dielectric constant, otherwise, any measurements taken would be unreliable. In other words, all known electrostrictive compositions suffer from the drawback that even if a high dielectric constant can be achieved for a particular temperature, if the environmental temperature varies slightly from $T_C$, then, the dielectric constant also varies resulting in an unreliable system.

There are also known various manufacturing processes for the formation of an electrostrictive ceramic material. Such processes include the conventional mixing of oxides. However, as is the case in many electroceramic compositions, many investigations continue in an effort to determine an optimum process for forming electrostrictive ceramic materials.

SUMMARY OF THE INVENTION

The present invention has been developed in view of the foregoing and to overcome the deficiencies of the prior art.

It is an object of the invention to provide a novel electrostrictive ceramic composition which maximizes dielectric constant and minimizes the dependence of the dielectric constant on temperature at a temperature near the Curie Point Temperature (i.e., $T_C$).

It is a further object of the invention to provide a fabrication process for reliably obtaining the new electrostrictive material.

Investigations have focussed upon the lead magnesium niobate-lead titanate (PMN-PT) solid solution system which is doped with small weight percentages of barium titanate (hereinafter referred to as BT) and/or strontium titanate (hereinafter referred to as ST). The PMN-PT-(BT,ST) solid solution system has been found to have a $T_C$ between 0° and 60° C. depending upon the precise composition of the system and, more importantly, shows a decreased dependence of the dielectric constant on temperature. Thus, for temperatures near $T_C$, the dielectric constant does not vary as much as it does in known electrostrictive compositions.

Moreover, in the novel PMN-PT-(BT,ST) composition, within the temperature range of 0° C. to 60° C., the material remains substantially completely paraelectric. It is important for PMN-PT-(BT,ST) to be paraelectric in the temperature range of 0° to 60° C. because if the material was ferroelectric rather than paralectric, any application of an external electric field would result in at least a partial poling of the material (i.e., an orientation of domains within the material). If poling were to occur, when an external field was switched, domain walls would have to move in accordance with the applied field. Such domain wall movement causes friction in the material. This friction is not desirable because it leads to hysteresis in the material. Hysteresis is not a problem in PMN-PT-(BT,ST), because the material remains paraelectric and domain orientation does not occur to any significant extent.

BRIEF DESCRIPTION OF THE DRAWINGS

The invention is described in detail with reference to the accompanying drawings, wherein:

FIG. 13A shows an X-ray diffraction pattern taken of a pellet surface having the composition 0.98 (0.88 PMN-0.12 PT)-0.02 BT; FIG. 13B shows an X-ray diffraction pattern taken from a pellet surface having the composition 0.96 (0.88 PMN-0.12 PT)-0.04 BT;

FIG. 14A shows an X-ray diffraction pattern taken from a pellet surface having the composition 0.98 (0.88 PMN-0.12 PT)-0.02 ST; and FIG. 14B shows an X-ray diffraction pattern taken from a pellet surface having the composition 0.96 (0.88 PMN-0.12 PT)-0.04 ST;

DETAILED DESCRIPTION OF THE INVENTION

Figure 1:
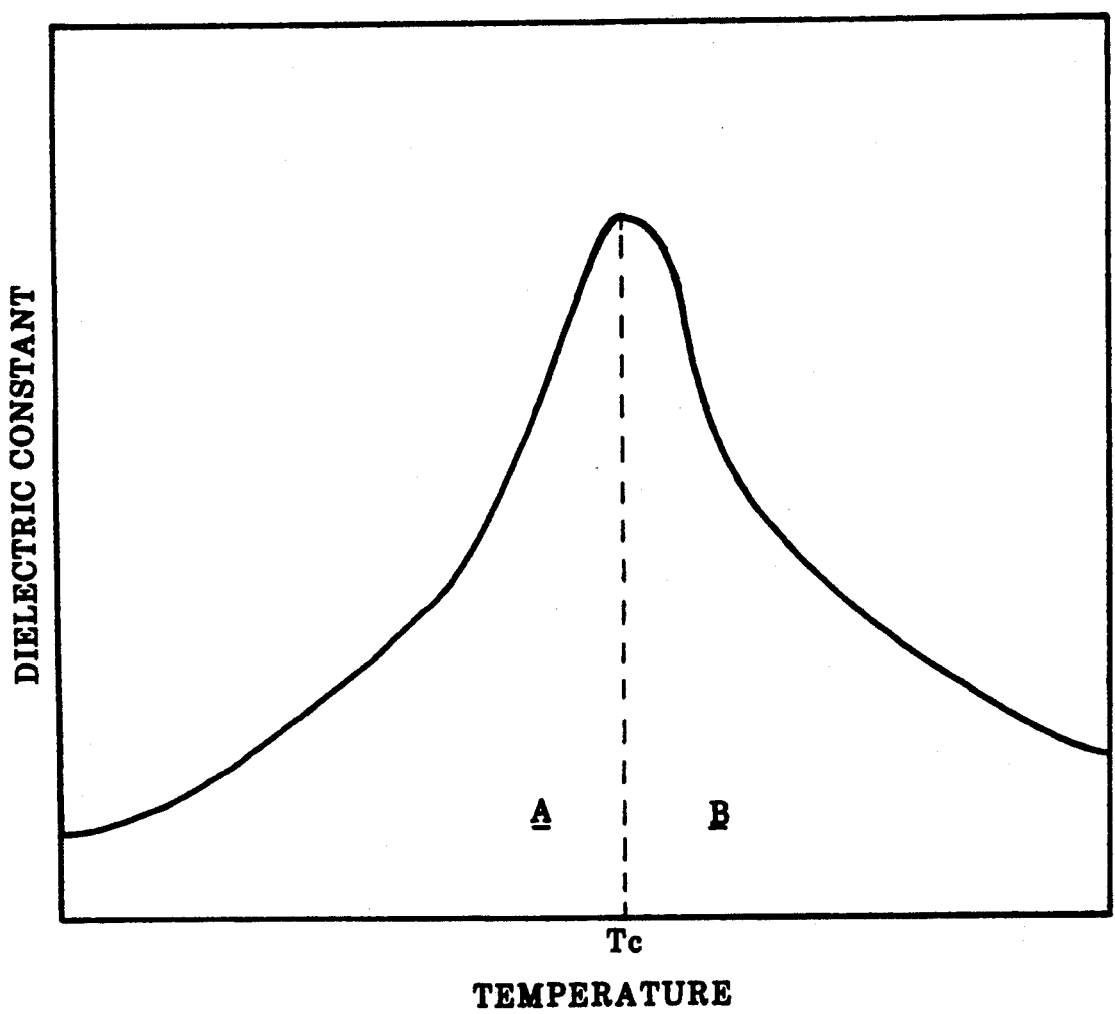
FIG. 1 is a representative curve of the dependence of dielectric constant on temperature for a typical prior art piezoelectric-electrostrictive material.
Figure 2A:
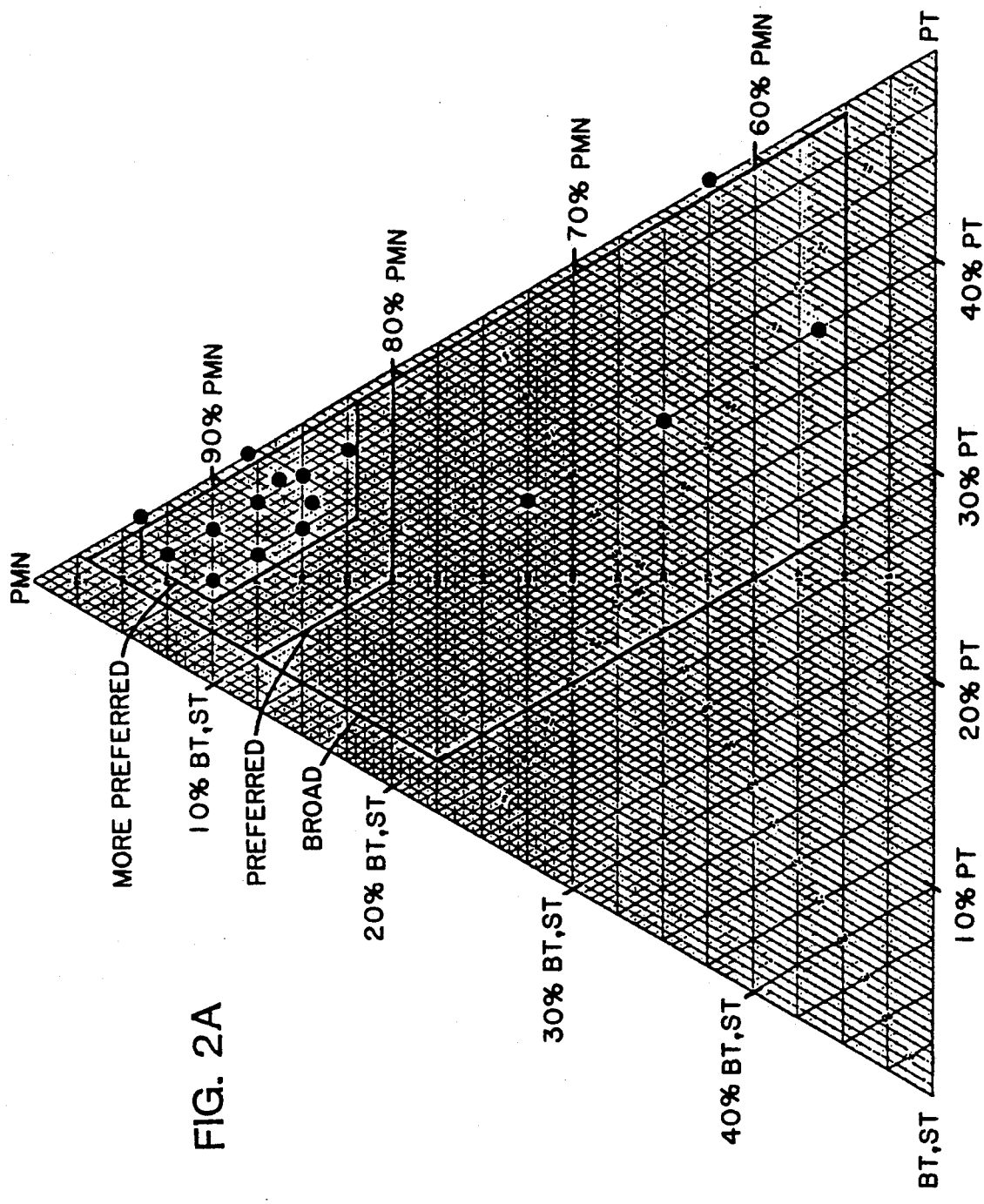
FIG. 2A is a ternary diagram showing the broad, preferred, and more preferred composition ranges of the present invention.
Figure 2B:
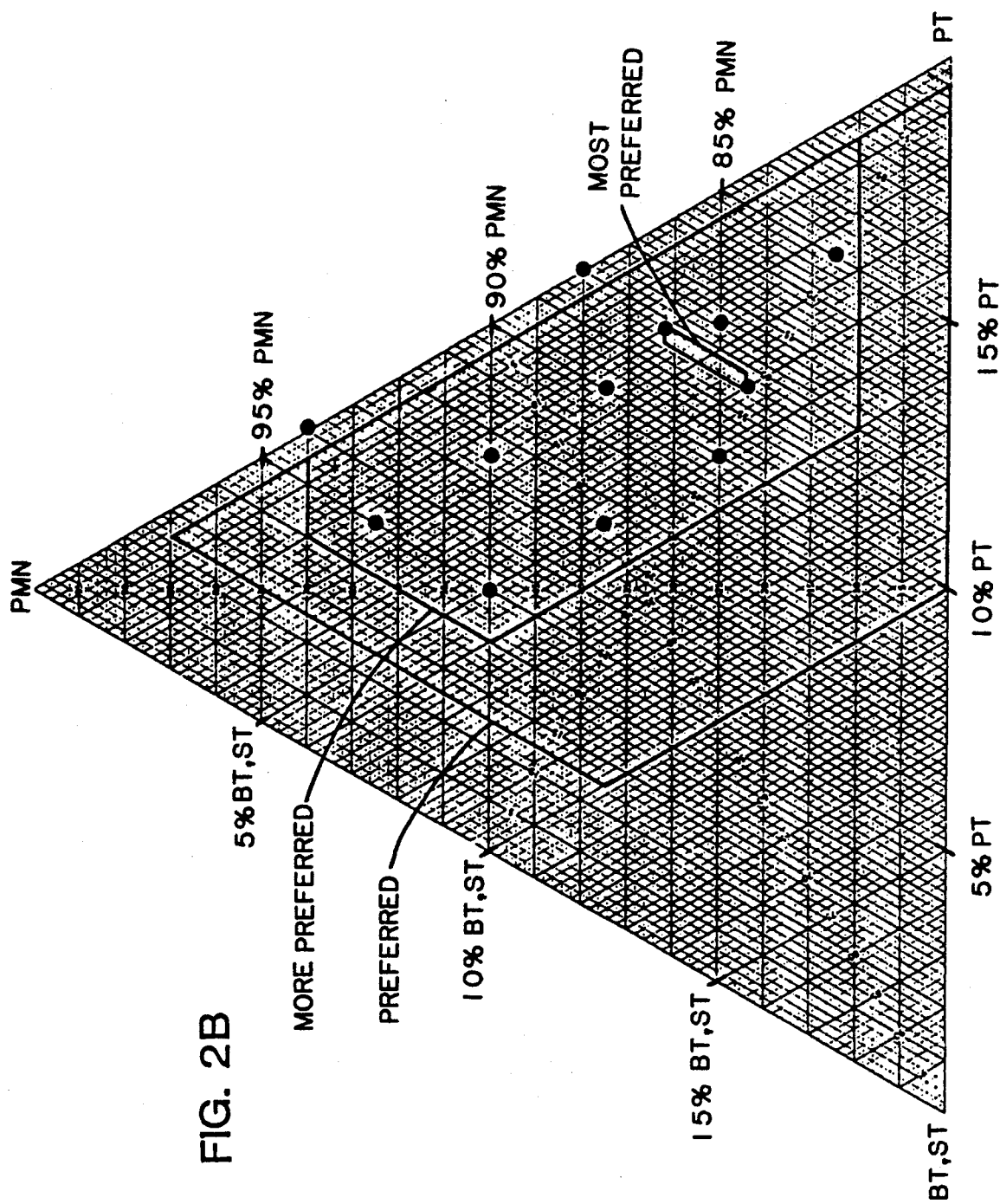
FIG. 2B is a ternary diagram showing the preferred, more preferred and most preferred composition ranges of the present invention.

The solid solution system of PMN-PT-(BT, ST) was examined in an effort to obtain a desirable electrostrictive composition. Table A illustrates the broad, preferred, more preferred, and most preferred compositional ranges of the present invention. FIG. 2A shows the broad, preferred, and more preferred composition ranges of the present invention, while FIG. 2B shows the preferred, more preferred, and most preferred ranges.

TABLE A

| COMPOSITIONAL RANGES (IN WEIGHT PERCENT) | | | |
|---|---|---|---|
| | PMN | PT | BT/ST |
| Broad | 55-97 | 2.5-45 | 0.5-20 |
| Preferred | 80-97 | 2.5-19 | 0.5-10 |
| More Preferred | 82-94 | 4-18 | 0.5-6 |
| Most Preferred | 84.5-86.2 | 11.5-11.8 | 2-4 |

The compositions set forth in Tables 1a and 1b exhibit extremely favorable electrostrictive properties. When choosing an electrostrictive composition, there is a trade-offf which must occur in the selection process. For example, when either of the dopants of BT or ST are added to the PMN-PT system, these dopants will reduce the dielectric constant. It is desirable for the dielectric constant to be reduced as little as possible so that the strain properties of the material are not sacrificed. However, it has been discovered that addition of these same dopants desirably broadens out or flattens the peak which occurs at $T_C$. Still further, it has been unexpectedly discovered that the addition of BT or ST to PMN-PT actually lowers $T_C$ (i.e., shifts $T_C$ to a lower temperature). This is quite unexpected because an artisan of ordinary skill would expect the addition of BT or ST to the PMN-PT system to follow normal mixing rules. Specifically, each of BT and ST has a $T_C$ which is higher than $T_C$ for PMN-PT. Thus, if this system followed the normal mixing rule, one would expect $T_C$ to be shifted to a higher temperature rather than a lower temperature. This unexpected shift in $T_C$ has not yet been explained. It is clear that the balancing or trade-off of the various electrical properties in an electrostrictive material is an important issue.

TABLE 1a

| Composition No. | Formula | Density (g/cc) | % Net Wt Loss |
|---|---|---|---|
| 1 | 0.88 PMN − 0.12 PT | 7.12 | 1.8 |
| 2 | 0.98 (0.88 PMN − 0.12 PT) − 0.02 BT | 7.27 | 0.3 |
| 3 | 0.96 (0.88 PMN − 0.12 PT) − 0.04 BT | 7.49 | 2.2 |
| 4 | 0.98 (0.88 PMN − 0.12 PT) − 0.02 ST | 7.50 | 1.7 |
| 5 | 0.96 (0.88 PMN − 0.12 PT) − 0.04 ST | 7.43 | 3.0 |

The ceramic compositions recited in Table 1a were obtained by the following procedure.

Starting powders of $Pb(Mg1/3Nb2/3)O_3$ (Cabot-Lot 47 "wet cake" purchased Dec. 1986) a fine grain size $PbTiO_3$ (Cabot) and Puratronic grade (99.999+%) PbO and $TiO_2$ were mixed together with either $BaCO_3$ or $SrCO_3$ in stoichiometric proportions. Either barium carbonate or strontium carbonate was utilized depending upon which of barium or strontium was desired to be used as a dopant. The "Lot 47 wet cake" was purchased from Cabot in December 1986 and it contains lead, magnesium and niobium compounds made by a solution precipitation process, said compounds being present in near stoichiometric proportions to obtain the desired final composition. The amount of "wet cake" used has to be adjusted for the loss of non-oxide constituents which burn-off during calcining. Therefore, adjustments must be made to the mixture to compensate for such burn-off. For example, after the wet cake has been calcined, only 68.62 weight % oxides remain. Thus, for every 100 grams of "wet cake", 68.62 grams of oxides will result after calcining (i.e., 68.62 grams of PMN material). The resultant powder mixture is present in stoichiometric proportions. This mixture is then wet milled for approximately 30 hours in water for homogenization, with Darvon C being added as a dispersant. The approximate distribution of starting materials for the wet milling step is 38 wt % powder mixture, 51 wt % 2 mm diameter $ZrO_2$ grinding balls, 2% Darvon C and 9 wt % water. The wet mixture was then dried and calcined in platinum crucibles for approximately 3 hours at approximately 750° C. The calcined powder which results has a particle size averaging approximately 1 micron in size. This particle size is due primarily to the size of the starting powder particles. After calcining, a second wet milling step occurs. This second wet milling occurs with ¼ inch $ZrO_2$ grinding balls and the wet milling is performed in freon. This second wet milling also occurs for approximately 30 hours. After the second wet milling step, PVA binder (Air Products #205) was dissolved in distilled water to form a liquid mixture. The calcined powder was then added to the liquid mixture. The powder-binder mixture was stirred on a hot plate until all the water had evaporated. The hot plate was held at a temperature of approximately 95°-130° C., preferably above 100° C., and the elapsed time of exposure on the hot plate was approximately 6 hours. The dried mass was then ground to −100 mesh by using an agate mortar and die pressed under a pressure of about 5000 psi to form a compact. The compacts were then isostatically pressed at about 45,000 psi to form pellets. The isostatically pressed pellets were placed in covered alumina crucibles packed in a powder of a substantially similar chemical composition to the pellets. This step is important because when the pellet-powder mixture was heated in the closed alumina crucibles, the atmosphere created in the alumina crucibles was similar in chemical composition to the chemical composition of the pellets, thereby preventing volatilization of elements such as Pb, and thus preventing deviation of the ceramic from stoichiometry. The alumina crucibles were then heated for binder burnout at a heating rate of approximately 40° C. per hour until a temperature of 600° C. was reached. The pellets were then heated at 900° C. per hour until a temperature of 980° C. was reached. The pellets were maintained at approximately 980° C. for about 3 hours followed by a cooling of the furnace. The cooling of the furnace occurs for about 3-5 hours.

Another embodiment of the present invention substitutes high purity oxides for the "wet cake" starting materials. (Hereinafter, an * preceding a composition signifies that the composition was prepared using high purity oxides instead of "wet cake" starting materials).

TABLE 1b

| Composition No. | Formula | Density (g/cc) | % Net Wt Loss |
|---|---|---|---|
| 6 | *0.88 PMN − 0.12 PT | 7.82 | 1.8 |
| 7 | *0.98 (0.88 PMN − 0.12 PT) − 0.02 BT | 7.66 | 1.7 |
| 8 | *0.96 (0.88 PMN − 0.12 PT) − 0.04 BT | 7.82 | 1.5 |
| 9 | *0.98 (0.88 PMN − 0.12 PT) − 0.02 ST | 7.85 | 1.7 |
| 10 | *0.96 (0.88 PMN − 0.12 PT) − 0.04 ST | 7.79 | 1.7 |

The ceramic compositions recited in Table 1b were obtained by the following procedure. Starting powders of MgO and Nb₂O₅ were mixed together and then wet milled in freon using substantially the same milling conditions as applied to the "wet cake" materials. The wet mixture was then dried and calcined in platinum crucibles for approximately 4 hours at approximately 1000° C., to form $MgNb_2O_6$. This high temperature calcining step enhances the reaction between MgO and $Nb_2O_5$. The calcined $MgNb_2O_6$ powder is then mixed with starting powders of $TiO_2$, PbO and either $BaCO_3$ or $SrCO_3$ in stoichiometric proportions. This mixture is then wet milled in freon using substantially the same milling conditions as described above. The resultant mixture is then dried and calcined in platinum crucibles for approximately 4 hours at approximately 800° C. The calcined powder which results has a particle size averaging approximately 1 micron in size. This particle size is due primarily to the size of the starting powder particles. After calcining, a third wet milling step occurs. This third wet milling occurs with ½ inch $ZrO_2$ grinding balls and the wet milling is performed in freon. This third wet milling also occurs for approximately 30 hours. After the third wet milling step, PVA binder (Air Products #205) was dissolved in distilled water to form a liquid mixture. The calcined powder was then added to the liquid mixture. The powder-binder mixture was stirred on a hot plate until all the water had evaporated. The hot plate was held at a temperature of approximately 95°-130° C., preferably above 100° C., and the elapsed time of exposure on the hot plate was approximately 6 hours. The dried mass was then ground to −100 mesh by using an agate mortar and die pressed under a pressure of about 5000 psi to form a compact. The compacts were then isostatically pressed at about 45,000 psi to form pellets. The isostatically pressed pellets were placed in covered alumina crucibles packed in a powder of a substantially similar chemical composition to the pellets. The alumina crucibles were then heated for binder burnout at a heating rate of approximately 40° C. per hour until a temperature of 600° C. was reached. The pellets were then heated at 900° C. per hour until a temperature of 1150° C. was reached. The pellets were maintained at approximately 1150° C. for about 3 hours followed by a cooling of the furnace. The cooling of the furnace occurs for about 3-5 hours.

In addition, further compositions within the scope of the invention were prepared. These compositions are set forth in Table 1c.

TABLE 1c

| Composition No. | Formula |
|---|---|
| 11 | *0.975 (0.846 PMN − 0.154 PT) − 0.025 BT |
| 12 | *0.975 (0.872 PMN − 0.128 PT) − 0.025 BT |
| 13 | *0.975 (0.897 PMN − 0.103 PT) − 0.025 BT |
| 14 | *0.975 (0.923 PMN − 0.077 PT) − 0.025 BT |
| 15 | *0.95 (0.895 PMN − 0.105 PT) − 0.05 BT |
| 16 | *0.95 (0.921 PMN − 0.079 PT) − 0.05 BT |
| 17 | *0.95 (0.947 PMN − 0.053 PT) − 0.05 BT |
| 18 | *0.90 (0.625 PMN − 0.375 PT) − 0.10 BT |
| 19 | *0.90 (0.722 PMN − 0.278 PT) − 0.10 BT |
| 20 | *0.90 (0.806 PMN − 0.194 PT) − 0.10 BT |
| 21 | *0.975 (0.846 PMN − 0.154 PT) − 0.025 ST |
| 22 | *0.975 (0.872 PMN − 0.128 PT) − 0.025 ST |
| 23 | *0.975 (0.897 PMN − 0.103 PT) − 0.025 ST |
| 24 | *0.975 (0.923 PMN − 0.077 PT) − 0.025 ST |
| 25 | *0.95 (0.895 PMN − 0.105 PT) − 0.05 ST |
| 26 | *0.95 (0.921 PMN − 0.079 PT) − 0.05 ST |

The range of densities for the doped materials made with "wet cake" was 7.27-7.50 g/cc (theoretical=8.1 g/cc). It was determined that the weight loss during sintering averaged approximately 1.8 weight %. X-ray diffraction analysis of each of the compositions verified that a 100% perovskite phase was present. The presence of a 100% perovskite phase is shown clearly in FIGS. 13A and 13B for BT doping; and in FIGS. 14A and 14B for ST doping.

The use of high purity oxides instead of the "wet cake" resulted in an increased density of 7.66 g/cc for PMN-PT doped with 2% BT. In general, compositions of the present invention made with high purity oxides may range in density form about 7.6 g/cc to about 8.0 g/cc. The presence of a 100% perovskite phase is shown clearly in FIG. 15 for 2% BT doping of *0.88 PMN-0.12 PT.

The fired pellets of material containing "wet cake" and material containing high purity oxides were then formed into discs having two parallel flat surfaces, (i.e., if any war page occured during firing, grinding is performed on the pellets to create two opposite parallelly located flat surfaces). After taking the density measurements, the flat surface of the discs were gold sputtered to create electrodes thereon. The edges of each pellet were masked so that gold did not sputter thereon. Silver paint was then painted on top of the gold sputtered layer. After the silver paint had dried, measurement of the electrical properties of the material could then be made.

To determine the electrical properties of the discs as a function of temperature, the silver painted discs were placed in a Delta Designs Environmental Chamber. The environmental chamber is a closed system which isolates the discs from the external atmosphere and varies the temperature of the internal atmosphere of the chamber between −70° C. (using liquid nitrogen) and 315° C., in order to achieve appropriate measurement temperatures. The electrical properties of compositions of the present invention are shown in Table 2, which also clearly shows that barium titanate addition to the "wet-cake" compositions reduces $T_C$ by approximately 5.3° C./mole % of BT. There is also a reduction in the dielectric constant of approximately 1169/mole % of BT. Strontium titanate additions also showed a similar effect of decreasing $T_C$, however, the decrease was 8.3° C./mole % of ST. Also, there was a decrease in the dielectric constant of 1422/mole % of ST.

Also, attention is drawn to the $\Delta T_C$ values which correspond to the "relaxor effect" in the electrostrictive materials. Particularly, $T_C$ for each of the samples increases by a particular amount as the frequency is increased between 1 and 100 kHz.

Table 2 also shows the effect of substituting high purity oxides for the "wet cake" starting materials. The increased dielectric constant in compositions 7-10, compared to compositions 2-5, can be partially attributed to the increased density resulting from the use of high purity oxide starting materials.

TABLE 2

| Electrical Properties of PMN-PT-(BT,ST) | | | |
|---|---|---|---|
| Composition No. | Tc (°C.) | Tc (°C.) (1-100 khz) | Kmax |
| 1 | 53.8 | 6.3 | 18968 |
| 2 | 44.2 | 9.7 | 16259 |
| 3 | 33.0 | 8.9 | 14291 |
| 4 | 37.0 | 6.0 | 17544 |
| 5 | 20.6 | 10.0 | 13280 |
| 6 | 54.3 | 5.9 | 23387 |
| 7 | 42.2 | 6.9 | 16701 |
| 8 | 28.9 | 9.5 | 17590 |

TABLE 2-continued

Electrical Properties of PMN-PT-(BT,ST)

| Composition No. | Tc (°C.) | Tc (°C.) (1-100 khz) | Kmax |
|---|---|---|---|
| 9 | 40.6 | 8.2 | 20620 |
| 10 | 21.6 | 10.3 | 16937 |
| 11 | 55.4 | 8.1 | 18750 |
| 12 | 42.6 | 7.8 | 15280 |
| 13 | 28.7 | 9.1 | 15290 |
| 14 | 16.2 | 12.9 | 16760 |
| 15 | 17.8 | 11.6 | 15910 |
| 16 | 6.7 | 12.6 | 14970 |
| 17 | −3.5 | 12.9 | 16410 |
| 18 | 138.2 | 0.3 | 16670 |
| 19 | 83.7 | 1.6 | 14490 |
| 20 | 28.8 | 11.9 | 14110 |
| 21 | 48.8 | 7.3 | 21270 |
| 22 | 35.1 | 8.3 | 14657 |
| 23 | 21.8 | 9.9 | 14840 |
| 24 | 8.3 | 11.2 | 15580 |
| 25 | 6.2 | 11.0 | 16710 |
| 26 | −5.6 | 11.8 | 14930 |
| 27 | −15.4 | 11.8 | 13400 |

Strontium titanate and barium titanate were selected as dopants because the effect of "A" site substitution in the perovskite structure was desired to be studied. Particularly, $Pb^{2+}$ has an ionic radius of 1.20 Å. $Sr^{2+}$ has an ionic radius of 1.13 Å and $Ba^{2+}$ has an ionic radius of 1.35 Å. Accordingly, the strontium and barium readily substitue into the $Pb^{2+}$ sites (A sites) in the $ABO_3$ perovskite structure.

Figure 3:
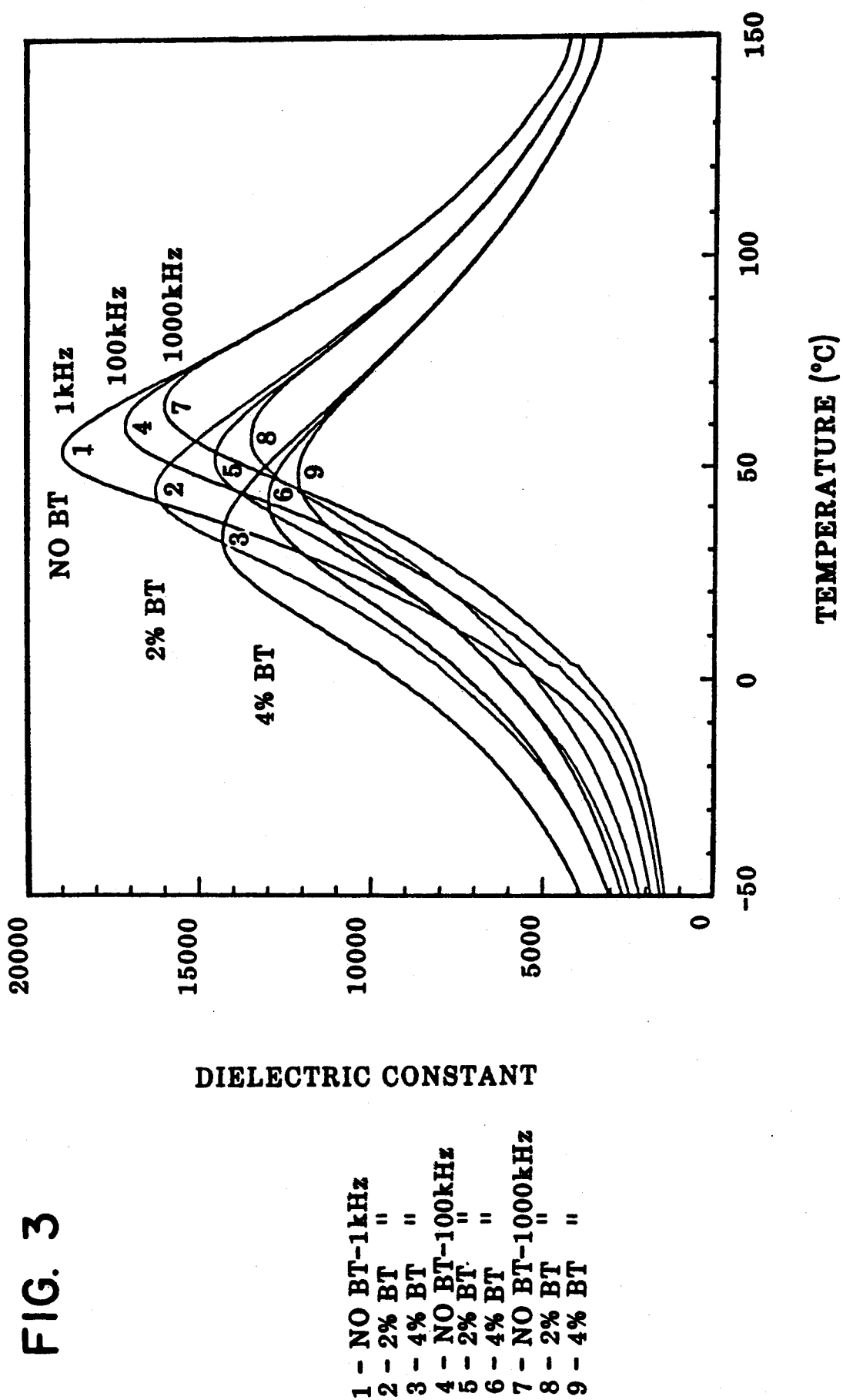
FIG. 3 shows the effect of doping a 0.88 PMN-0.12 PT system with 2% BT and 4% BT.
Figure 4:
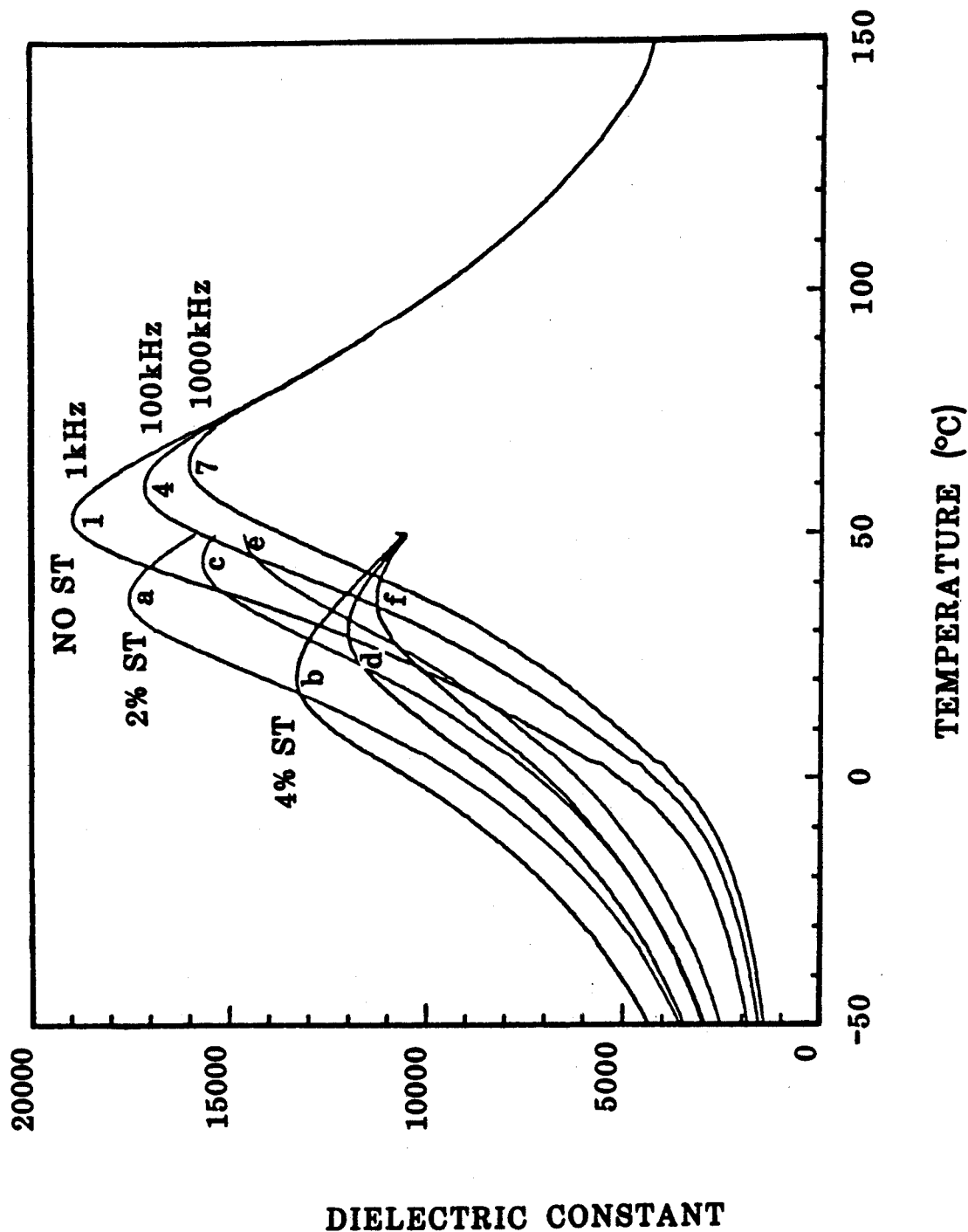
FIG. 4 shows the effect of doping a 0.88 PMN-0.12 PT system with 2% ST and 4% ST.

In addition to the reduction of $T_C$, FIGS. 3 and 4 graphically display the change in dielectric constant as a function of temperature with the additions of BT and ST. Particularly, in reference to FIG. 3, it is clear that the dielectric constant decreases for each of the three frequencies tested, namely, 1 kHz, 100 kHz and 1000 kHz, as the amount of BT which is added to PMN-PT increases. However, the peak broadening which occurs with the addition of 2% BT (i.e., 2 wt % BT), and which occurs even more dramatically with the addition of 4% BT (i.e., 4 wt % BT) is very important. It is this peak broadening which results in a higher temperature stability for the dielectric constant and thus, will result in an increased range of use temperatures for devices made using compositions 2-3. Thus, for the first time, an electrostrictive composition has been discovered which has an improved temperature stability relative to all known electrostrictive compositions. Consequently, the potential applications in which electrostrictive devices could be used has been dramatically increased.

FIG. 4 shows a similar graphic depiction of the dependence of dielectric constant on temperature with ST being added instead of BT. However, the general trend for the addition of ST to the PMN-PT solid solution system is similar to that shown in FIG. 3. Particularly, $T_C$ shifts to lower temperatures and $K_{max}$ decreases with the addition of ST at 2%, and decreases further with the addition of 4% ST. Likewise, the addition of ST also results in a peak broadening at $T_C$. It should be noted In addition to the reduction of $T_C$, FIGS. 3 and 4 graphically display the change in dielectric constant as a function of temperature with the additions of BT and ST. Particularly, in reference to FIG. 3, it is clear that the dielectric constant decreases for each of the three frequencies tested, namely, 1 kHz, 100 kHz and 1000 kHz, as the amount of BT which is added to PMN-PT increases. However, the peak broadening which occurs with the addition of 2% BT (i.e., 2 wt % BT), and which occurs even more dramatically with the addition of 4% BT (i.e., 4 wt % BT) is very important. It is this peak broadening which results in a higher temperature stability for the dielectric constant and thus, will result in an increased range of use temperatures for devices made using compositions 2-3. Thus, for the first time, an electrostrictive composition has been discovered which has an improved temperature stability relative to all known electrostrictive compositions. Consequently, the potential applications in which electrostrictive devices could be used has been dramatically increased.

FIG. 4 shows a similar graphic depiction of the dependence of dielectric constant on temperature with ST being added instead of BT. However, the general trend for the addition of ST to the PMN-PT solid solution system is similar to that shown in FIG. 3. Particularly, $T_C$ shifts to lower temperatures and $K_{max}$ decreases with the addition of ST at 2%, and decreases further with the addition of 4% ST. Likewise, the addition of ST also results in a peak broadening at $T_C$. It should be noted that temperature measurements for ST substitution in the PMN-PT solid solution system occurred only as high as 50° C. because any further temperature measurements were deemed unnecessary.

Figure 5:
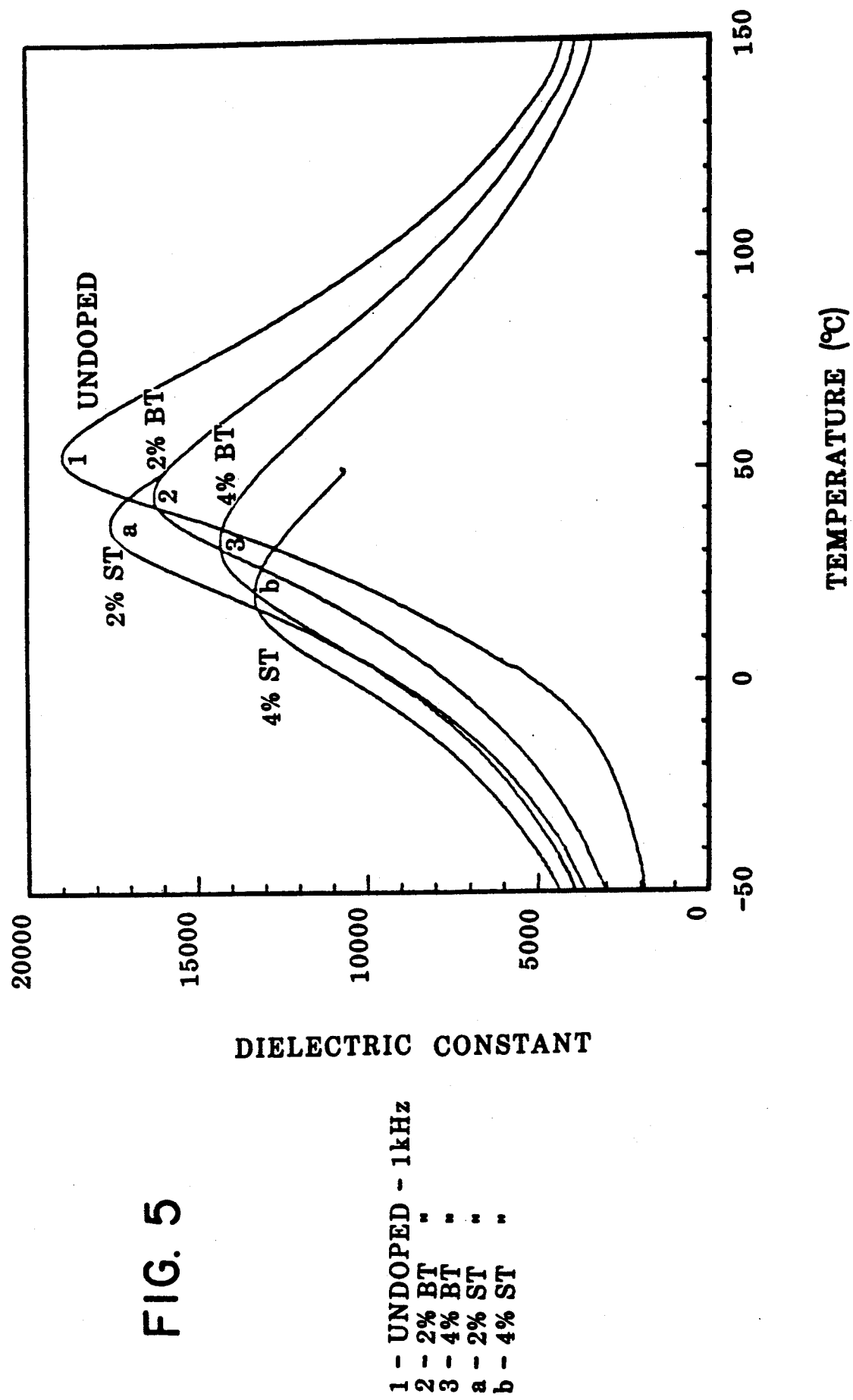
FIG. 5 shows a superimposition of each of the 1 kHz dopant curves shown in FIGS. 3 and 4 and compares same with undoped 0.88 PMN-0.12 PT.

FIG. 5 shows a direct comparison of the dependence of dielectric constant on temperature at a frequency of 1 kHz for undoped 0.88PMN-0.12PT and the dependence of the dielectric constant on temperature for that temperature measurements for ST substitution in the PMN-PT solid solution system occurred only as high as 50° C. because any further temperature measurements were deemed unnecessary.

FIG. 5 shows a direct comparison of the dependence of dielectric constant on temperature at a frequency of 1 kHz for undoped 0.88PMN-0.12PT and the dependence of the dielectric constant on temperature for each of compositions 2-5 (i.e., the curves of FIGS. 3 and 4 are superimposed on each other to create new FIG. 5). It is observed that the addition of 2% ST and 2% BT produce a similar dependence of dielectric constant with temperature. However, the addition of 4% ST substantially reduces the dielectric constant when compared to the addition of 4% BT. The precise reasons for this difference are not yet understood. However, as a general statement, it is clear that with dopant levels of either BT or ST being as small as 2%, peak broadening occurs. Moreover, it is clear that with 2% dopant levels, $T_C$ shifts to a lower temperature. As previously discussed, the shift in $T_C$ to a lower temperature is completely unexpected because an artisan of ordinary skill would normally expect the addition of dopant such as ST and BT to cause a shift in $T_C$ to a higher temperature and not a shift to a lower temperature. The precise mechanism for the shift in $T_C$ is not yet understood.

Figure 6:
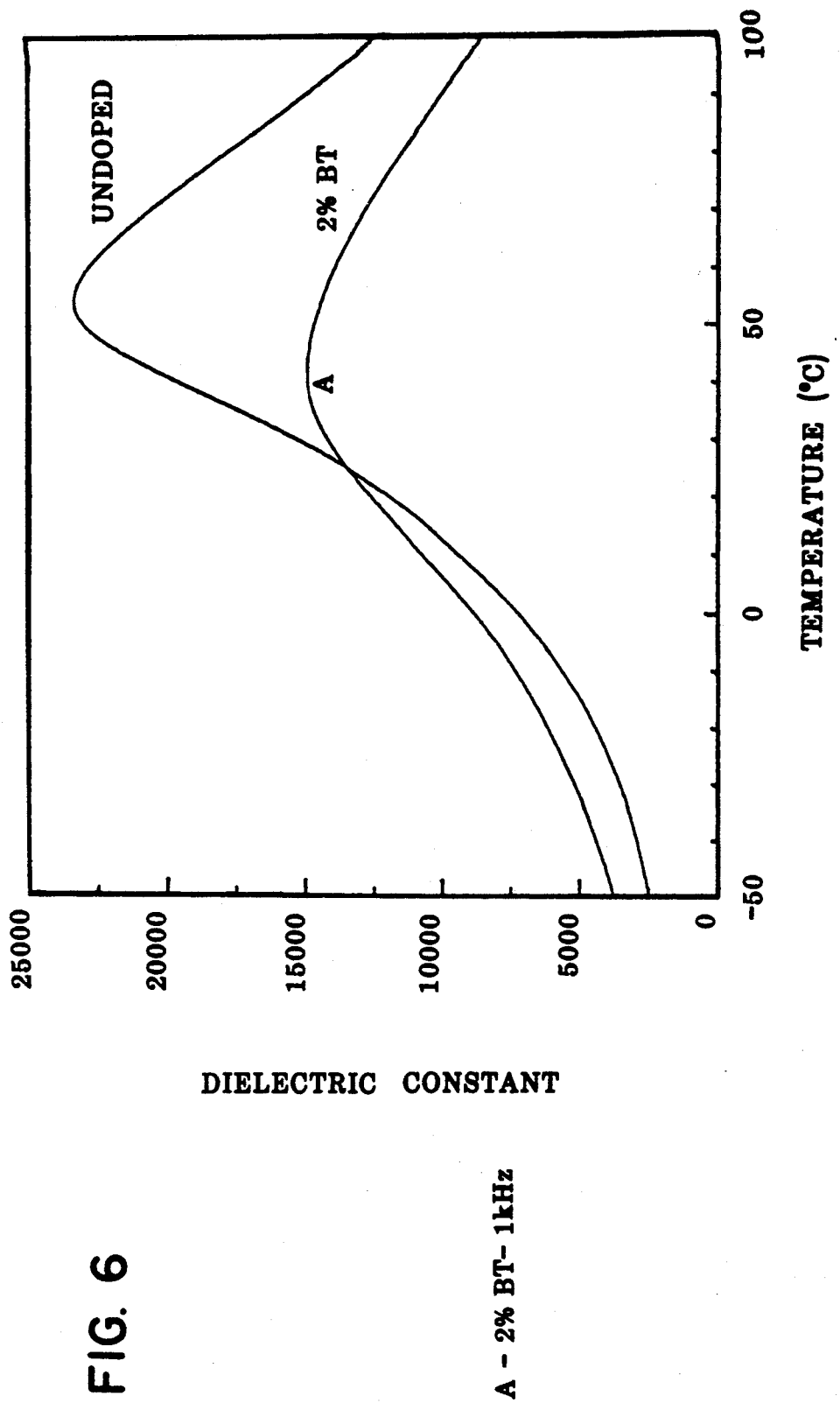
FIG. 6 shows the effect of doping a 0.88 PMN-0.12 PT system made with high purity oxides with 2% BT and compares same with undoped 0.88 PMN-0.12 PT made with high purity oxides.

FIG. 6 shows a direct comparison of the dependence of dielectric constant on temperature at a frequency of 1 kHz for undoped *0.88 PMN-0.12 PT and the dependence of dielectric constant on temperature for *0.88 PMN-0.12 PT doped with 2% BT. It is observed that the use of high purity oxides instead of "wet cake" increase the dielectric constant and shifts Tc to a lower temperature.

Table 3a shows the percent deviation of the dielectric constant from a room temperature value of the dielectric constant for compositions 1-7 at 1 kHz.

TABLE 3a

Temperature Stability of PMN-PT-(BT,ST)

| Composition No. | Formula | Dielectric Constant at 0° C./25° C./Tc (T° C.)/50° C. | Percent Deviation of Dielectric Constant (at 1 KHZ) Relative to 25° C. Over a Range of 0 to 50° C. |
|---|---|---|---|
| 1 | 0.88 PMN − 0.12 PT (undoped) | 4983/10,875/18,968 (53.8)/18713 | −54 to +72 |
| 2 | +.02 BT | 7537/12,706/16,259 (44.2)/15932 | −41 to +28 |
| 3 | +.04 BT | 9300/13,840/14,291 (33)/13030 | −33 to +3 |
| 4 | +.02 ST | 9163/15,413/17,544 (37)/15,827 | −41 to +14 |
| 5 | +.04 ST | 10,445/13,170/13280 (20.6)/10,732 | −21 to +0.8 |
| 6 | 0.88 PMN − 0.12 PT | 7318/13,574/23,387 (54.3)/22,987 | −46 to +72 |
| 7 | +0.02 BT | 8888/13,531/16701 (42.2)/14717 | −34 to +10 |

Table 3a displays illustrative quantatative values which show the superior temperature stability of the claimed electrostrictive composition. The present invention should not be interpreted as limited to the specific values displayed in Table 3a.

Table 3b shows the percent diviation of dielectric constant from a room temperature value of the dielectric constant for compositions 8–27 at 1 kHz.

Figure 7:
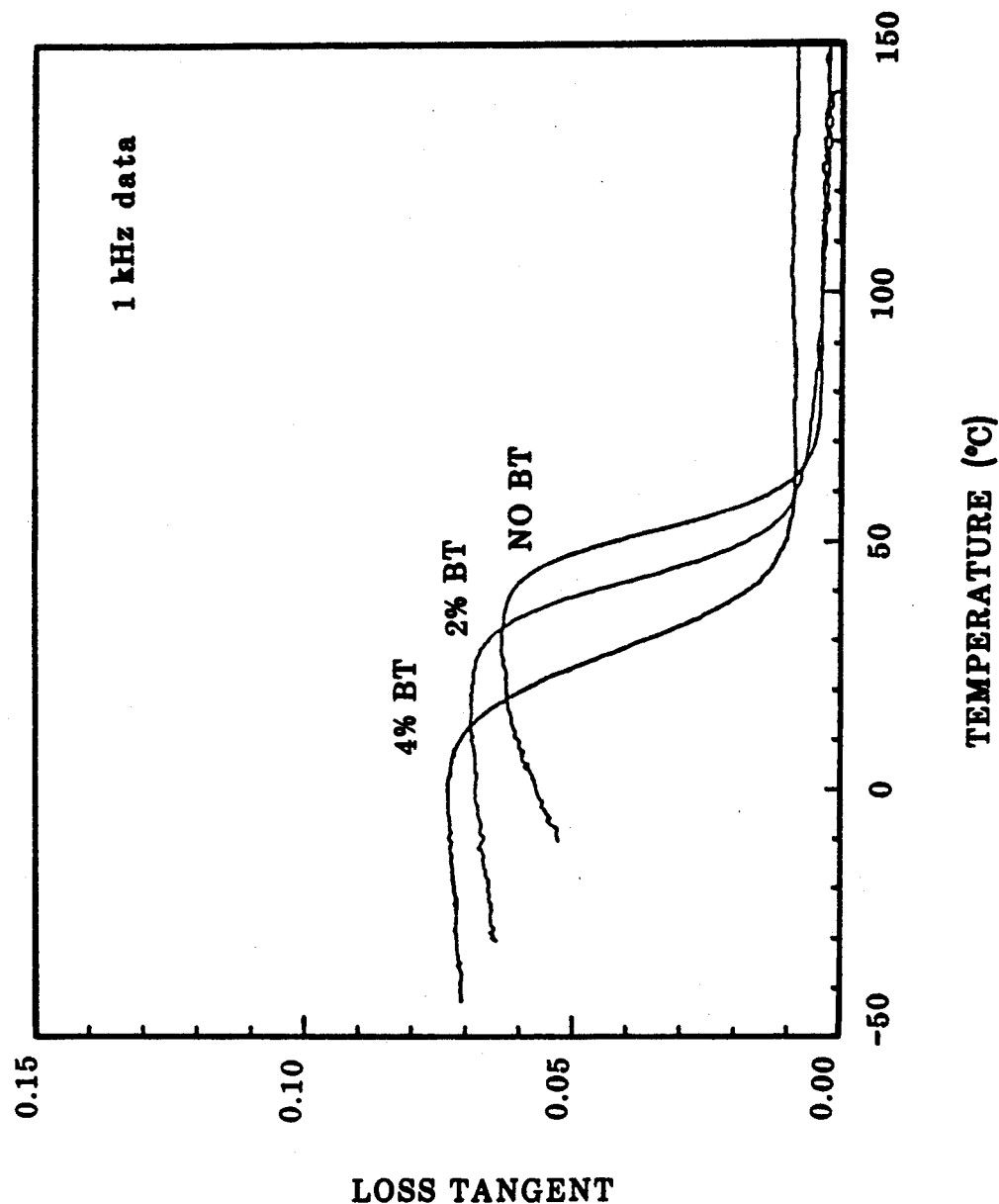
FIG. 7 shows the loss tangent data at 1 kHz as a function of temperature for undoped 0.88 PMN-0.12 PT and 0.88 PMN-0.12 PT doped with 2% BT and 4% BT.
Figure 8:
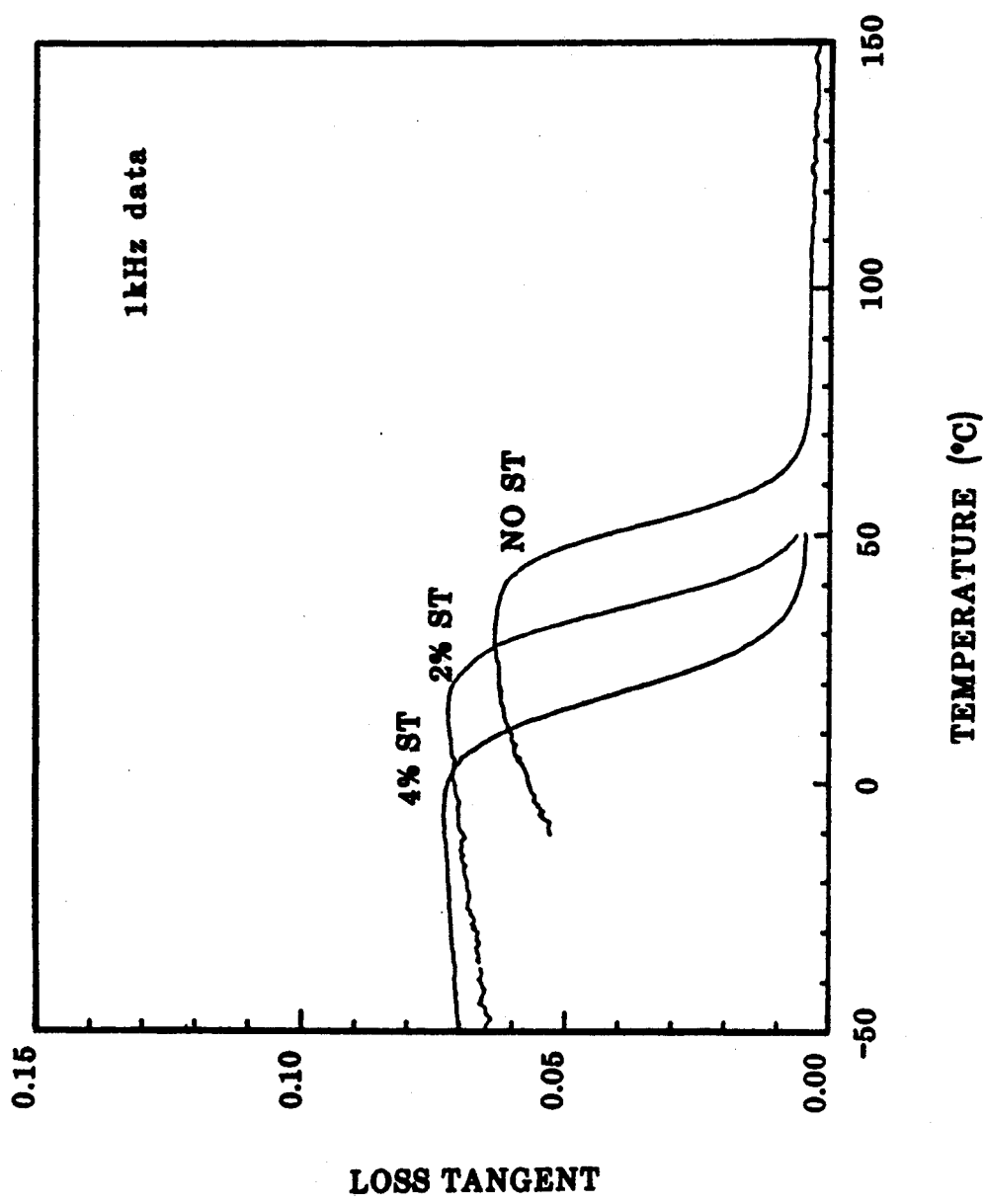
FIG. 8 shows the loss tangent data at 1 kHz as a function of temperature for undoped 0.88 PMN-0.12 PT and 0.88 PMN-0.12 PT doped with 2% ST and 4% ST.
Figure 9:
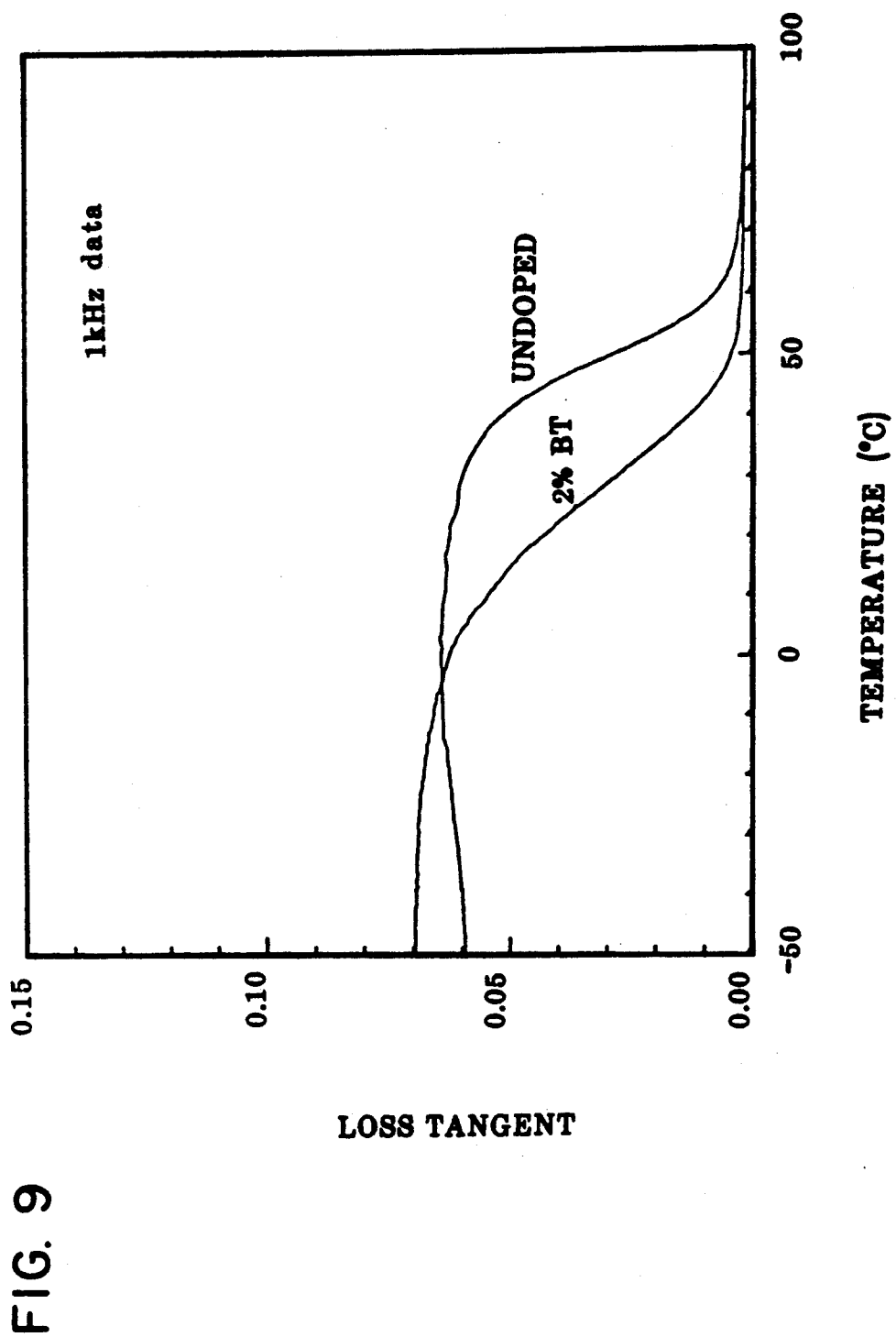
FIG. 9 shows the loss tangent data at 1 kHz as a function of temperature for undoped 0.88 PMN-0.12 PT made with high purity oxides and 0.88 PMN-0.12 PT made with high purity oxides and doped with 2% BT.

FIGS. 7–9 show the loss tangent data as a function of temperature for compositions 1–7 at 1 kHz. It is clear from each of these Figures that the loss in each of compositions 2–5 and 7 is completely acceptable within the desired use range of 0°–60° C. Accordingly, losses are not a problem in the new electrostrictive compositions.

TABLE 3b

Temperature Stability of PMN-PT-(BT,ST)

| Composition No. | Percent Deviation of Dielectric Constant (at 1 khz) Relative to 25° C. Over a Range of 0–50° C. |
|---|---|
| 8 | −35.1 to +1.0 |
| 9 | +41.6 to −27.4 |
| 10 | +33.0 to 0.0 |
| 11 | −38.5 to +44.3 |
| 12 | −30.4 to +9.3 |
| 13 | −27.0 to +0.6 |
| 14 | −14.3 to +3.5 |
| 15 | +10.8 to −21.5 |
| 16 | +16.1 to −22.8 |
| 17 | +24.8 to −25.1 |
| 21 | −44.0 to +46.0 |
| 22 | −28.8 to +2.9 |
| 23 | −15.0 to +0.6 |
| 24 | −22.1 to +9.5 |
| 25 | −39.0 to +15.0 |
| 26 | −29.0 to +33.0 |
| 27 | −26.0 to +41.0 |

Table 4 shows strain at 1 megavolt per meter for various compositions of the present invention.

TABLE 4

| Composition No. | Strain ($10^{-4}$) (1 mV/m) |
|---|---|
| 7 | 84 |
| 8 | 4.5 |
| 9 | 5.3 |
| 10 | 2.5 |
| 11 | 11.2 |
| 12 | 7.9 |
| 13 | 5.3 |
| 14 | 3.7 |
| 15 | 3.7 |
| 16 | 2.0 |
| 17 | 1.5 |
| 18 | 3.5 |
| 19 | 8.9 |
| 20 | 5.4 |
| 21 | 11.4 |
| 22 | 7.2 |
| 23 | 5.5 |
| 24 | 2.2 |
| 25 | 2.9 |
| 26 | 1.6 |
| 27 | 0.9 |

Figure 10:
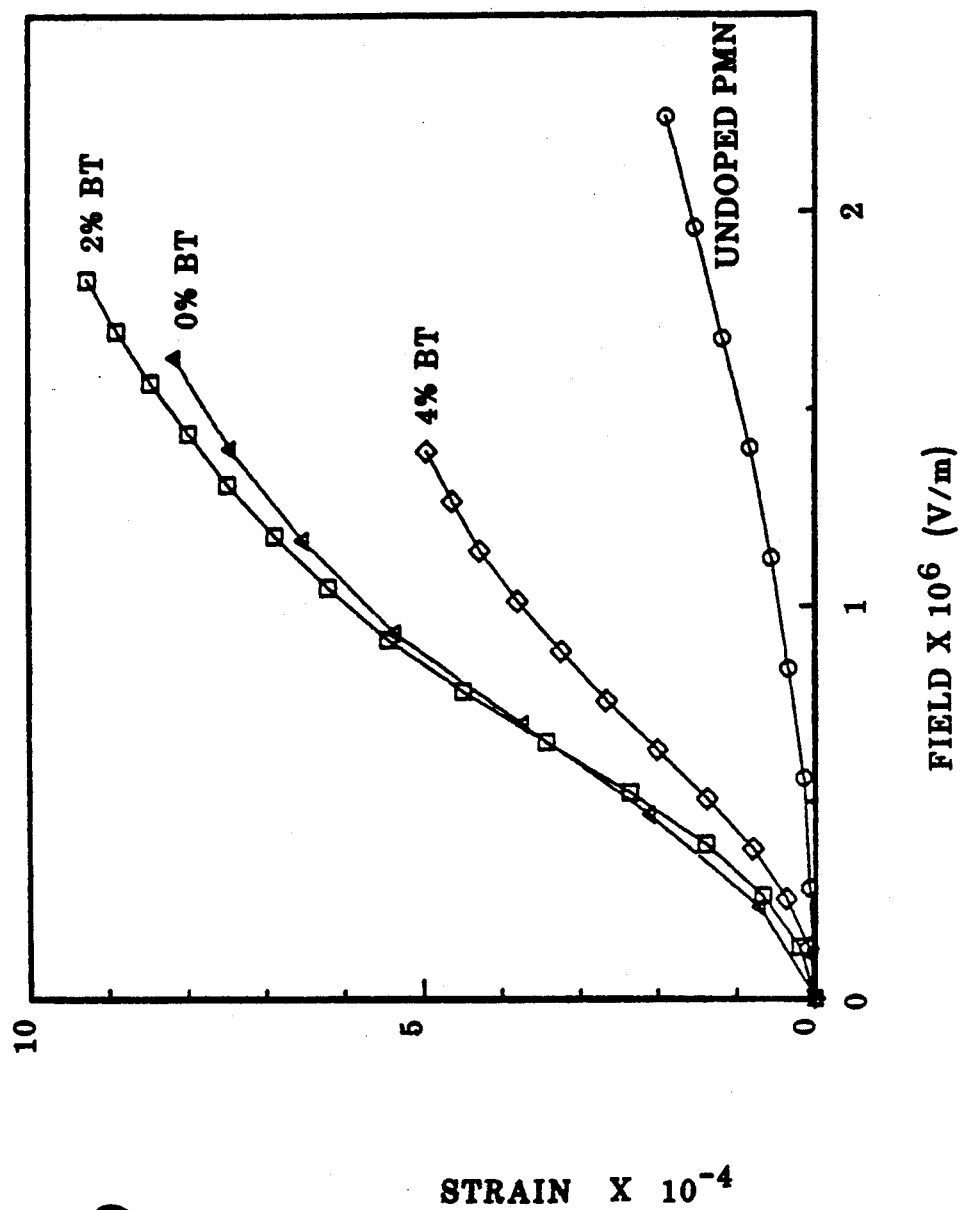
FIG. 10 shows the relationship between strain and applied electric field at room temperature for: undoped PMN, undoped 0.88 PMN-0.12 PT, and 0.88 PMN-0.12 PT doped with 2% BT and with 4% BT.
Figure 11:
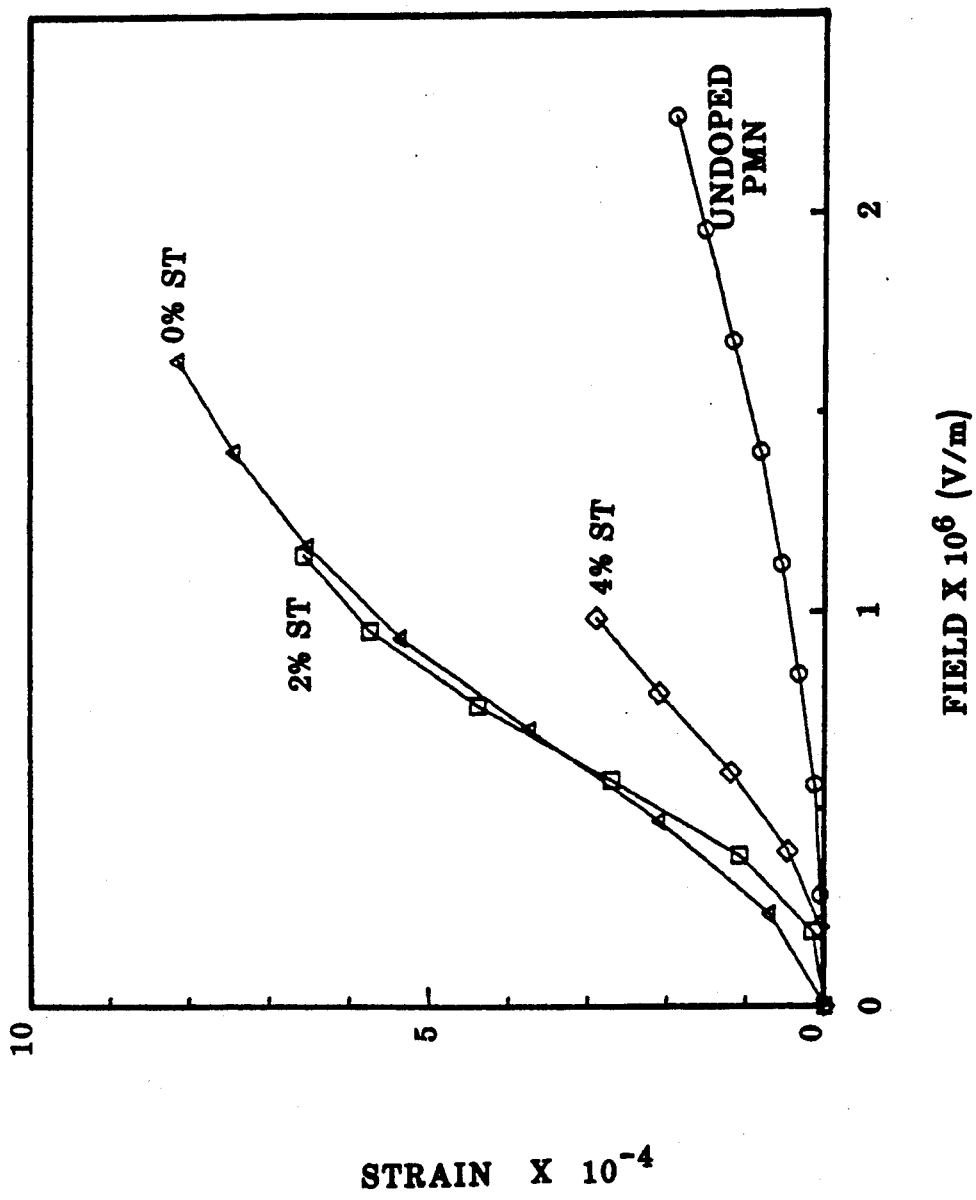
FIG. 11 shows the relationship between strain and applied electric field at room temperature for: undoped PMN, undoped 0.88 PMN-0.12 PT, and 0.88 PMN-0.12 PT doped with 2% ST and 4% ST.

FIG. 10 graphically displays the relationship between strain and applied field at room temperature. It is clear from FIG. 10 that composition 2, which corresponds to 2% BT being added to the 0.88 PMN-0.12 PT system, exhibited superior strain results relative to composition 3, which corresponds to doping 0.88PMN-0.12PT with 4% BT. The strain data was obtained by connecting the silver painted pellets to an LVDT gauge (linear variable differential transducer) and thereafter applying an electric field to each sample. The electric field was varied between 0 and slightly greater than 2.5 megavolts/meter. All measurements of strain as a function of electric field were performed at room temperature. It is also noted in FIG. 11, that the relationships for strain versus field for compositions 4 and 5 (ST doping) are similar to those discussed above (i.e., 2% ST doped 0.88PMN-0.12PT yield superior strain results, as compared to 4% ST doped 0.88PMN-0.12PT).

Figure 12:
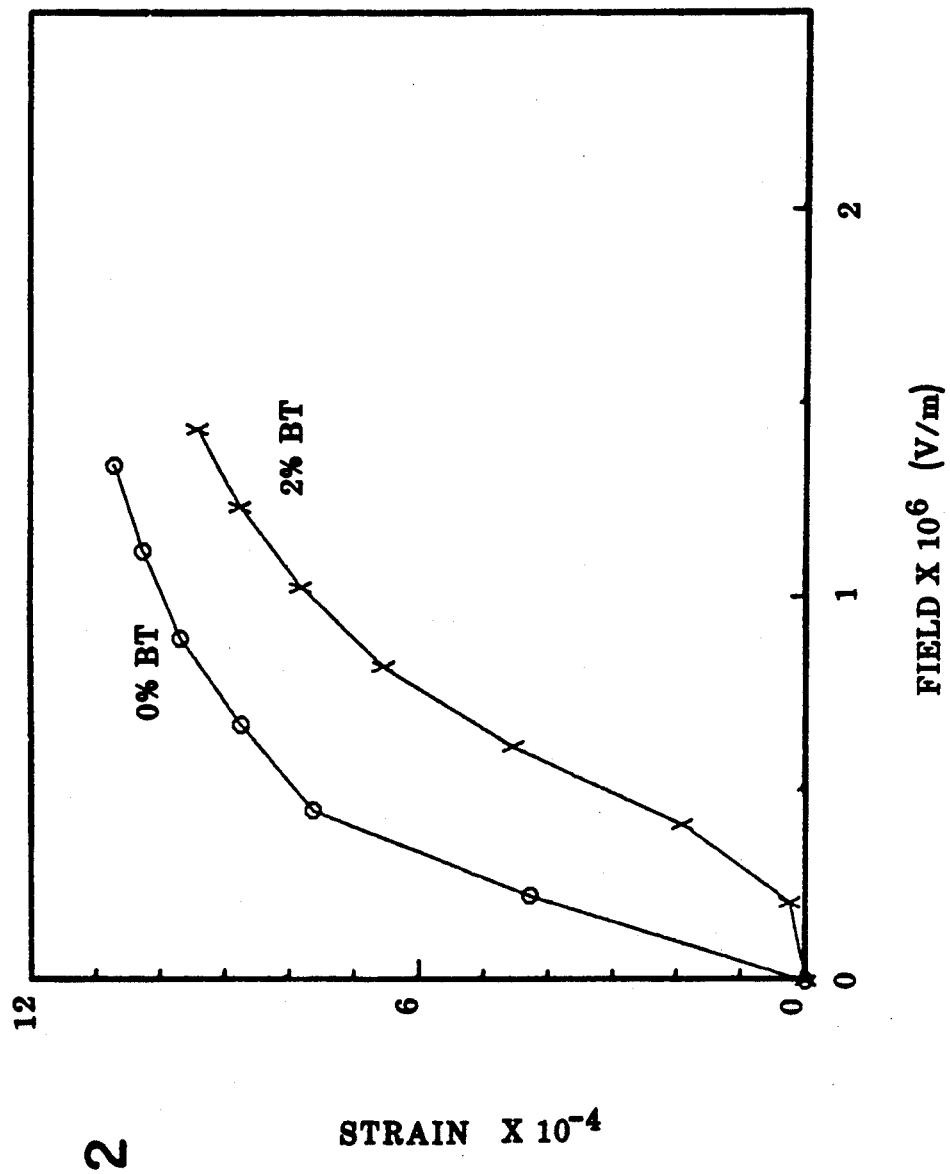
FIG. 12 shows the relationship between strain and applied electric field at room temperature for: undoped 0.88 PMN-0.12 PT made with high purity oxides and 0.88 PMN-0.12 PT made with high purity oxides and doped with 2% BT.

FIG. 12 graphically displays the relationship between strain and applied field at room temperature for composition 7. It is observed that the use of high purity oxides instead of "wet cake" enhances the strain versus electric field characteristic of *0.88 PMN-0.12 PT doped with 2% BT.

Referring to Equation 1b, changes in electrostrictive strain due to variation in temperature are related to changes in the dielectric constant (K), which is the only temperature dependent variable in the right side of the equation. Increased additions of BT and ST result in reduced temperature dependence on K, i.e., strain, as evidenced by broader Curie peaks for those materials.

Figures 1, 15:
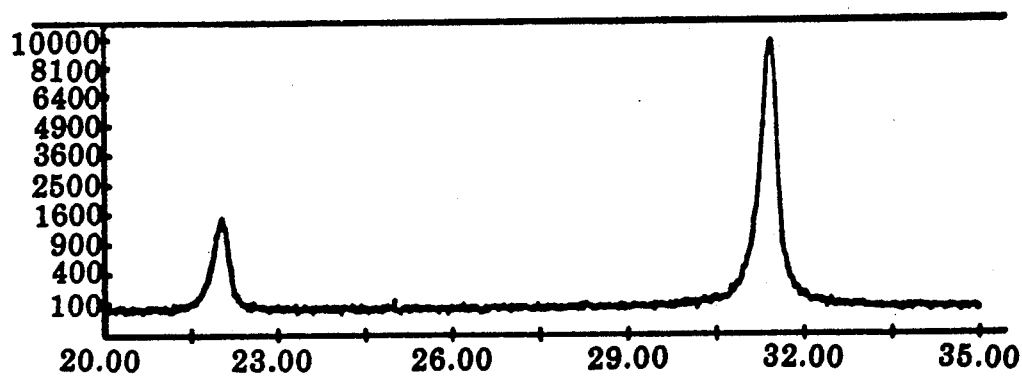
FIG. 15 shows an X-ray diffraction pattern taken of a pellet surface having the composition 0.98 (0.88 PMN-0.12 PT)-0.02 BT made with high purity oxides.
Figures 2, 15:
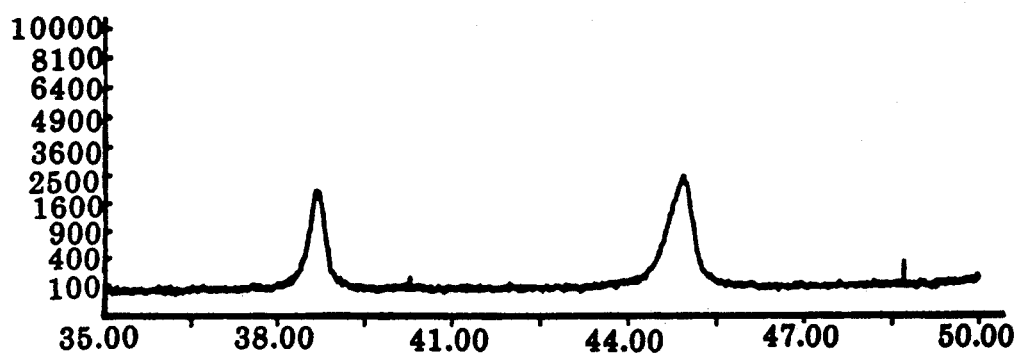

FIGS. 13A and 13B are X-ray diffraction patterns taken from surfaces of pellets corresponding in composition to compositions 2 and 3, respectively. It is clear from FIGS. 13A and 13B that a 100% perovskite phase resulted. Likewise, FIGS. 14A and 14B are X-ray diffraction patterns taken from surfaces of pellets corresponding in composition to compositions 4 and 5, respectively. These Figures also show that a 100% perovskite phase was produced. FIG. 15 is an X-ray diffraction pattern taken from the surface of a pellet corresponding in composition to composition 7. This Figure also shows that a 100% perovskite phase was produced.

Due to the discovery of these novel electrostrictive compositions, new applications for electrostrictors can now be explored. Specifically, as previously discussed, known electrostrictive compositions could not be utilized for applications which involved an exposure to a range of temperatures due to the severe dependence of the dielectric constant on temperature. The peak broadening which has been discovered and which is due to the addition of BT or ST to the PMN-PT system, now permits electrostrictors to be used for a large range of applications.

The new electrostrictive compositions can be used for all prior art applications such as dot matrix printers, microelectronic measurement devices, and the like. Additionally, the new electrostrictive compositions can be utilized in many different areas never before possible, due primarily to the absence of hysteresis in the new compositions and the peak broadening. Thus, great accuracy (i.e., reliability) of the compositions for various applications, even when exposed to varying temperature ranges, is to be expected. Such applications include the use of the new electrostrictive compositions as actuators in active sonar, underwater vehicle guidance and robotics. Many of these applications involve the use of the electrostrictive device in combination with a motion amplifier. The displacement in a small electrostrictive device, by itself, is typically not large enough (e.g. a few tens of microns) to result in an appreciable displacement of another object. Accordingly, it is sometimes necessary to connect electrostrictive actuators to appropriate motion amplifiers.

Stated in greater detail, electrostrictive actuators can be used in active sonar devices because they generate a very accurate sound wave (i.e., due to the absence of hysteresis). Electrostrictive actuators can also be used for underwater vehicle guidance, such as in torpedos. Specifically, screws and gears are typically being used to control the rudders of torpedos. The screws and gears are inherently not accurate and are quite heavy. Thus, electrostricive actuators, when coupled with appropriate motion amplifiers, could provide for very accurate control of rudders in a torpedo. It is also foreseeable that electrostrictive actuators could be used in robotics. Specific ways that electrostrictive actuators could be used in robotics include the control of movement such as the fingers or a wrist of a robot arm; the actuators can be used in combination with a hydraulic system for opening and closing valves to control flow of fluid therethrough; and the actuator can be used as tactile feedback sensors (i.e., electrostrictive actuators may be used to provide tactile stimulation of a controllers hand, or finger, to create a sensation relating to how hard a robot hand is gripping an object). Additionally, electrostrictive actuators may be used to control the opening and closing of valves thereby replacing less accurate solenoids. It is also foreseeable that electrostrictors could be used for measuring electrical properties of electrical chips. For example, it is sometimes necessary to move a measuring device a small amount (a few tens of an augstrom to a few microns) to check for various electrical properties in a formed chip. Such movements could be controlled by an electrostrictive actuator. This list of potential applications should not be considered to be totally inclusive, but rather, representative of uses for electrostrictive compositions.

While the present invention has been disclosed in its preferred embodiments, it is to be understood that the invention is not limited to the precise disclosure contained herein, but may otherwise be embodied with various changes, modifications and improvements which may occur to those skilled in the art, without departing from the scope of the invention as defined in the appended claims.

What is claimed is:

1. A method of making an electrostrictive material comprising:
    mixing together powders of $Pb(Mg_{1/3}Nb_{2/3})O_3$, $PbTiO_3$, $PbO$, $TiO_2$ and at least one dopant material selected from the group consisting of $SrCO_3$ and $BaCO_3$ in desired stoichiometric proportions to form a mixture;
    wet milling said mixture;
    drying and calcining said mixture to form a calcined powder;
    wet milling said calcined powder;
    forming a binder-distilled water mixture;
    adding said calcined powder to said binder-distilled water mixture to form a slurry;
    evaporating substantially all water from the slurry to form a dried mass;
    grinding the dried mass to −100 mesh powder;
    dry pressing said −100 mesh powder to form compacts;
    isostatically pressing said compacts to form pellets;
    packing the pellets into a powder having substantially the same chemical composition as the pellets; and
    firing the pellets.

2. The method of claim 1, wherein the powders are mixed in appropriate proportions to result in a solid solution of an electrostrictive ceramic composition comprising a solid solution of 55–97 weight percent of lead magnesium niobate, 2.5–45 weight percent of lead titanate and 0.5–20 weight percent of a dopant selected from the group consisting of barium titanate and strontium titanate.

3. The method of claim 1, wherein said wet milling of said mixture occurs for approximately 30 hours.

4. The method of claim 1, wherein said wet milling of said mixture is effected by combining about 38 weight percent of said mixture, 51 weight percent of zirconia grinding balls, 2 weight percent disperant and 9 weight percent $H_2O$.

5. The method of claim 1, wherein said zirconia grinding balls have a diameter of about 2 mm.

6. The method of claim 1, wherein said wet milling of said calcined powder is effected by combining said calcined powder with freon and about ½ inch diameter zirconia grinding balls.

7. The method of claim 1, wherein said firing of the pellets occurs by heating the pellets at 40° C./hour until reaching a temperature of about 600° C. and thereafter heating the pellets at 900° C./hour until reaching a temperature of about 980° C.

8. The method of claim 1, wherein the pellets are fired at a temperature of about 980° C. for about 3 hours.

9. A method of making an electrostrictive material comprising:
- mixing together powders of MgO and $Nb_2O_5$ in desired stoichiometric proportions to form a mixture;
- wet milling said mixture;
- drying and calcining said mixture to form a calcined powder;
- mixing together said calcined powder, with starting powders of $TiO_2$, PbO and at least one dopant material selected from the group cnosisting of $BaCO_3$ and $SrCO_3$ in desired stoichiometric proportions to form a second mixture;
- wet milling said second mixture;
- drying and calcining said second mixture to form a second calcined powder;
- wet milling said second calcined powder;
- forming a binder-distilled water mixture;
- adding said second calcined powder to said binder-distilled water mixture to form a slurry;
- evaporating substantially all water from the slurry to form a dried mass;
- grinding the dried mass to form a $-100$ mesh powder;
- dry pressing said $-100$ mesh powder to form compacts;
- isostatically pressing said compacts to form pellets;
- packing the pellets into a powder having substantially the same chemical composition as the pellets; and
- firing the pellets.

10. The method of claim 9, wherein the powders are mixed in appropriate proportions to result in a solid solution of an electrostrictive composition comprising a solid solution of 55-97 weight percent of lead magnesium niobate, 2.5-45 weight percent of lead titanate and 0.5-20 weight percent of a dopant selected from the group consisting of barium titanate and strontium titanate.

11. The method of claim 9, wherein said wet milling of said mixture occurs for approximately 40 hours.

12. The method of claim 9, wherein said wet milling of said calcined powder is effected by combining said calcined powder with freon and about ½ inch diameter zirconia grinding balls.

13. The method of claim 9, wherein said firing of the pellets occurs by heating the pellets at 40° C./hour until reaching a temperature of about 1150° C.

14. The method of claim 9, wherein the pellets are fired at a temperature of about 1150° C. for about 3 hours.

* * * * *